United States Patent
Kelso et al.

(10) Patent No.: US 10,591,137 B2
(45) Date of Patent: Mar. 17, 2020

(54) WAVELENGTH CONVERTER AND LIGHT-EMITTING DEVICE HAVING SAME

(71) Applicants: John F. Kelso, Exeter, NH (US); Kathleen A. Lawson, Amesbury, MA (US)

(72) Inventors: John F. Kelso, Exeter, NH (US); Kathleen A. Lawson, Amesbury, MA (US)

(73) Assignee: OSRAM SYLVANIA INC., Wilmington, MA (US)

( * ) Notice: Subject to any disclaimer, the term of this patent is extended or adjusted under 35 U.S.C. 154(b) by 1596 days.

(21) Appl. No.: 14/038,709

(22) Filed: Sep. 26, 2013

(65) Prior Publication Data
US 2015/0085497 A1  Mar. 26, 2015

(51) Int. Cl.
*F21V 9/08* (2018.01)
*G02F 1/355* (2006.01)
(Continued)

(52) U.S. Cl.
CPC ............ *F21V 9/08* (2013.01); *C04B 35/01* (2013.01); *C04B 35/44* (2013.01); *C04B 35/50* (2013.01); *C09K 11/7774* (2013.01); *F21K 9/64* (2016.08); *H01L 33/502* (2013.01); *H01L 33/505* (2013.01); *C04B 2235/3224* (2013.01); *C04B 2235/3225* (2013.01);
(Continued)

(58) Field of Classification Search
CPC combination set(s) only.
See application file for complete search history.

(56) References Cited

U.S. PATENT DOCUMENTS

| 4,631,144 A | 12/1986 | Beers et al. |
| 2009/0066221 A1* | 3/2009 | Schmidt ............ C09K 11/7774 313/503 |

(Continued)

FOREIGN PATENT DOCUMENTS

| WO | WO 2006/072918 | 7/2006 |
| WO | WO 2006/097876 | 9/2006 |

(Continued)

OTHER PUBLICATIONS

Park et al., 2D SiNx photonic crystal coated Y3Al5O13:Ce3+ ceramic plate phosphor for high-power white light-emitting diodes, Optics Express, v. 19, No. 25 (2011) 25593-25601.

(Continued)

*Primary Examiner* — Georgia Y Epps
*Assistant Examiner* — Jacob R Stern
(74) *Attorney, Agent, or Firm* — Edward Podszus (57) ABSTRACT

An alumina-based ceramic wavelength converter is described having a surface layer containing a second phase of alumina, preferably as alumina crystallites. The surface layer is formed as a result of the sintering process used to form the bulk ceramic which is itself substantially transparent. The ceramic wavelength converter is combined with a light emitting diode to form a light emitting device. Preferably, the ceramic wavelength converter is comprised of an alumina-based phosphor represented by a general formula $A_3B_5O_{12}$:Ce, wherein A is Y, Sc, La, Gd, Lu, or Tb and B is Al, Ga or Sc.

22 Claims, 4 Drawing Sheets

(51) Int. Cl.
  *G02F 1/35* (2006.01)
  *H01L 33/50* (2010.01)
  *C04B 35/44* (2006.01)
  *C04B 35/01* (2006.01)
  *C09K 11/77* (2006.01)
  *C04B 35/50* (2006.01)
  *F21K 9/64* (2016.01)

(52) U.S. Cl.
  CPC .......... *C04B 2235/3227* (2013.01); *C04B 2235/3286* (2013.01); *C04B 2235/3418* (2013.01); *C04B 2235/6562* (2013.01); *C04B 2235/6581* (2013.01); *C04B 2235/6582* (2013.01); *C04B 2235/764* (2013.01); *C04B 2235/786* (2013.01); *C04B 2235/80* (2013.01); *C04B 2235/95* (2013.01); *C04B 2235/9653* (2013.01); *H01L 33/501* (2013.01); *H01L 2933/0091* (2013.01)

(56) References Cited

U.S. PATENT DOCUMENTS

2009/0108507 A1 4/2009 Messing et al.
2012/0326344 A1 12/2012 Kelso et al.
2014/0232259 A1* 8/2014 Kawashima ....... H05B 33/0803
                                                          313/512

FOREIGN PATENT DOCUMENTS

| WO | WO 2008/056300 | 5/2008 |
| WO | WO 2009/105581 | 8/2009 |
| WO | WO 2013/015454 | 1/2013 |

OTHER PUBLICATIONS

Park et al., Selecting Morphology of Y3Al5O13:Ce3+ Phosphors for Minimizing Scattering Loss in the pc-LED Package, J. Electrochem. Soc., 159 (4) (2012) J96-J106.

Kochawattana et al., Sintering and grain growth in SiO2 doped Nd:YAG, J. Eur. Ceram. Soc., 28 (2008) 1527-1534.

Ikesue et al., Fabrication and Optical Properties of High-Performance Polycrystalline Nd:YAG Ceramics for Solid State Lasers, J. Am. Ceram. Soc., 78 (4) (1995) 1033-40.

* cited by examiner

WAVELENGTH CONVERTER AND LIGHT-EMITTING DEVICE HAVING SAME

BACKGROUND OF THE INVENTION

Light emitting diodes (LEDs) generate visible or non-visible light in a specific region of the electromagnetic spectrum. The light output from an LED may be, for example, light in the blue, red, green, ultra-violet (UV), and/or near-UV spectral regions, depending on the material composition of the LED. When it is desired to construct an LED light source that produces light of a color different from the output color of the LED, it is known to convert the light output from the LED having a first wavelength or wavelength range (the "primary light" or "excitation light") to light having a second wavelength or wavelength range (the "secondary light" or "emission light") using photoluminescence.

Photoluminescence generally involves absorbing higher energy primary light with a wavelength-conversion material such as a phosphor or mixture of phosphors. Absorption of the primary light can excite the wavelength-conversion material to a higher energy state. When the wavelength-conversion material returns to a lower energy state, it emits secondary light, generally of a different wavelength/wavelength range than the primary light. The wavelength/wavelength range of the secondary light depends on the composition of wavelength-conversion material used. As such, secondary light of a desired wavelength/wavelength range may be attained by proper selection of wavelength-conversion material. This process may be understood as "wavelength down conversion," and an LED combined with a wavelength-conversion structure that includes wavelength-conversion material, such as phosphor, to produce secondary light, may be described as a "phosphor-converted LED" (pc-LED) or "wavelength-converted LED."

The wavelength-conversion material may be formed into solid monolithic ceramic piece by an appropriate method such as pressing and sintering the powdered material. The ceramic wavelength converter, typically in the form of a plate, may then be attached directly to the LED die to achieve a chip-level-conversion (CLC) of the light emitted by the LED or it may be placed at some distance from the light emitting surface of the LED in order to achieve a remote-conversion arrangement. Transparent ceramic wavelength converters have the potential to generate the highest level of conversion efficiency for these applications because they do not suffer losses from backscattering converted light to the LED source where it can be absorbed. However, as ceramic wavelength converters are made with a higher degree of transparency, total internal reflection (TIR) becomes a limiting factor, restricting the amount of light that can be extracted from the converter and thereby limiting the efficacy of the light source.

SUMMARY OF THE INVENTION

The present invention combines the advantage of the high conversion efficiency of a transparent ceramic with a light extraction improvement that increases in lumen output. More particularly, an alumina-based ceramic wavelength converter is provided with a surface layer containing a second phase of alumina, preferably as alumina crystallites. The surface layer is formed as a result of the sintering process used to form the bulk ceramic which is itself substantially transparent.

In accordance with an aspect of the invention, there is provided a wavelength converter comprising a solid monolithic piece of a luminescent ceramic material. The ceramic material is comprised of an alumina-based phosphor capable of converting primary light having a first peak wavelength into secondary light having a second peak wavelength. A bulk portion of the converter is substantially transparent and the converter has at least one major surface with an as-sintered surface layer having an alumina second phase.

In accordance with another aspect of the invention, there is provided a light-emitting device comprising a light-emitting diode that emits a primary light having a first peak wavelength and a wavelength converter positioned to receive the primary light from the light-emitting diode. The wavelength converter comprises a solid monolithic piece of a luminescent ceramic material. The ceramic material comprises an alumina-based phosphor capable of converting at least a portion of the primary light into secondary light having a second peak wavelength. A bulk portion of the converter is substantially transparent and the converter has at least one major surface with an as-sintered surface layer having an alumina second phase.

DETAILED DESCRIPTION OF THE INVENTION

For a better understanding of the present invention, together with other and further objects, advantages and capabilities thereof, reference is made to the following disclosure and appended claims taken in conjunction with the above-described drawings.

As used herein, a "ceramic wavelength converter" means a wavelength converter comprised of solid monolithic ceramic piece that has been formed by sintering a powered material such as an inorganic phosphor. Generally, the as-sintered ceramic wavelength converter is polycrystalline. The term "ceramic wavelength converter" does not include wavelength converters comprised of dispersions of phosphor particles in a polymer matrix such as silicone or epoxy. The term "surface layer" means a layer that is adjacent to and includes the relevant surface.

Substantially transparent means that the material exhibits little scattering of light passing through the material and more particularly it exhibits an in-line transmittance of at least 60% as measured in a region of the electromagnetic spectrum where the material has no absorption peaks. For example, in-line transmittance for a cerium-activated aluminum garnet material would be measured at a wavelength above 550 nm since the material has strong absorption peaks at 350 and 460 nm due to the $Ce^{3+}$ activator. In particular, a xenon lamp that is filtered to scan a range of wavelengths is generally used to measure the in-line transmittance.

An LED "die" (also referred to as an LED "chip") is an LED in its most basic form, i.e., in the form of the small individual pieces produced by dicing the much larger wafer onto which the semiconducting layers were deposited. The LED die can include contacts suitable for the application of electric power.

References to the color of a phosphor, LED or conversion material refer generally to its emission color unless otherwise specified. Thus, a blue LED emits a blue light, a yellow phosphor emits a yellow light and so on.

Figure 1:
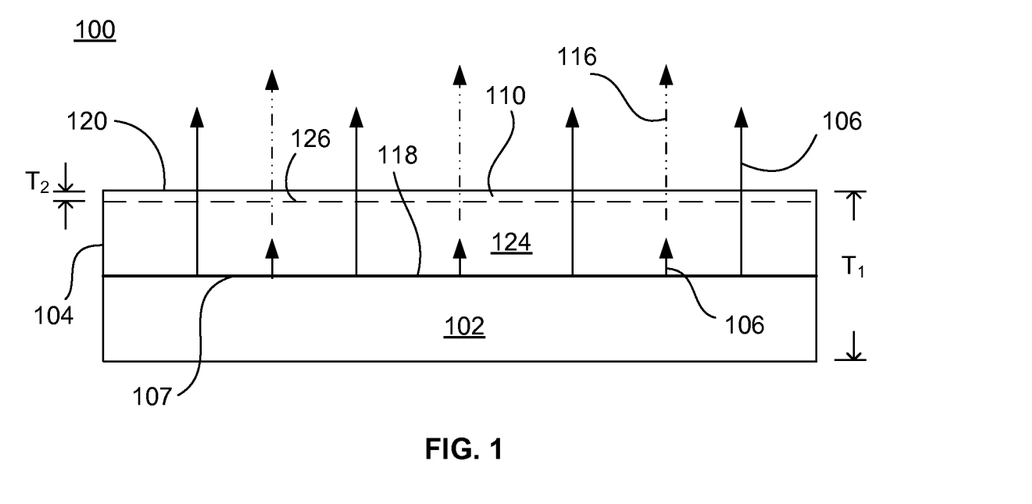
FIG. 1 is a schematic illustration of a cross section of a light-emitting device utilizing an LED with a ceramic wavelength converter according to an embodiment of this invention.

Referring now to the drawings with greater particularity, there is shown in FIG. 1 a light-emitting device 100 in the form of a pc-LED having ceramic wavelength converter 104. The ceramic wavelength converter is comprised of an alumina ($Al_2O_3$)-based phosphor material, for example, a luminescent yttrium aluminum garnet, $Y_3Al_5O_{12}$ (which may also be written as $3Y_2O_3 \cdot 5Al_2O_3$). Preferably, the ceramic wavelength converter is comprised of an alumina-based phosphor which may represented by the general formula $A_3B_5O_{12}$:Ce, wherein A is Y, Sc, La, Gd, Lu, or Tb and B is Al, Ga or Sc. Preferably, A is Y, Gd, Lu or Tb and B is Al. More preferably, the phosphor is one of $Y_3Al_5O_{12}$:Ce, $(Y,Gd)_3Al_5O_{12}$:Ce, $Tb_3Al_5O_{12}$:Ce, and $Lu_3Al_5O_{12}$:Ce, which may be referred to as YAG:Ce, YGdAG:Ce, TbAG:Ce and LuAG:Ce, respectively. The wavelength converter 104 generally has a thickness $T_1$ of between 20 µm and 500 µm and preferably between 100 µm and 250 µm. In a preferred embodiment, the wavelength converter has the shape of a flat plate, although it is not limited to such.

Primary light 106 emitted from light-emitting surface 107 of the blue-emitting LED die 102 passes into ceramic wavelength converter 104 which converts at least a portion of the blue light into a secondary light 116 having a different peak wavelength, e.g., a yellow light. The color of the light eventually emitted from the light-emitting surface 120 of converter 104 will depend on the ratio of the amount of unconverted primary light 106 that passes through the converter to the amount of primary light that is converted to secondary light 116 within the converter.

In the embodiment shown in FIG. 1, the ceramic wavelength converter 104 has a polished bottom surface 118 which faces the light-emitting surface 107 of the LED die 102. The opposite side comprising the light-emitting surface 120 has an integral, as-sintered surface layer 110 containing a second phase of alumina, preferably as alumina crystallites. The surface layer boundary is denoted by dashed line 126. The bulk material 124 of ceramic wavelength converter 104 is a substantially transparent, single-phase material comprised of the alumina-based phosphor.

It is believed that surface layer 110 enhances the light emission from converter 104 by reducing total internal reflection and also increasing scattering of primary light 106 leading to greater conversion and increased secondary light 116 emission. Preferably, the surface layer 110 has a thickness $T_2$ of less than about 50 µm and more preferably less than about 10 µm. The preferred alumina crystallites in the surface layer range in size from about 0.5 µm to about 25 µm and preferably from about 1 µm to about 10 µm. Preferably, the alumina second phase covers between about 1 to about 50 percent of the major surface of the converter, and even more preferably about 5 to about 25 percent.

During sintering, the alumina $2^{nd}$ phase forms at or near both major surfaces of the ceramic wavelength converter yielding a surface layer containing the alumina second phase on both sides. In order to remove the surface layer, it is necessary to use an aggressive means such as mechanical polishing since the alumina second phase is strongly bound to the primary phase of the alumina-based phosphor. In some applications (as shown in FIG. 1), it may be desirable to polish the side of the converter that mates with the light-emitting surface of the LED, e.g., bottom surface 118. However, as described below with respect to FIG. 2, it is not necessary to polish one side of the converter and is generally preferable to maintain the surface layer on both sides of the converter.

Figure 2:
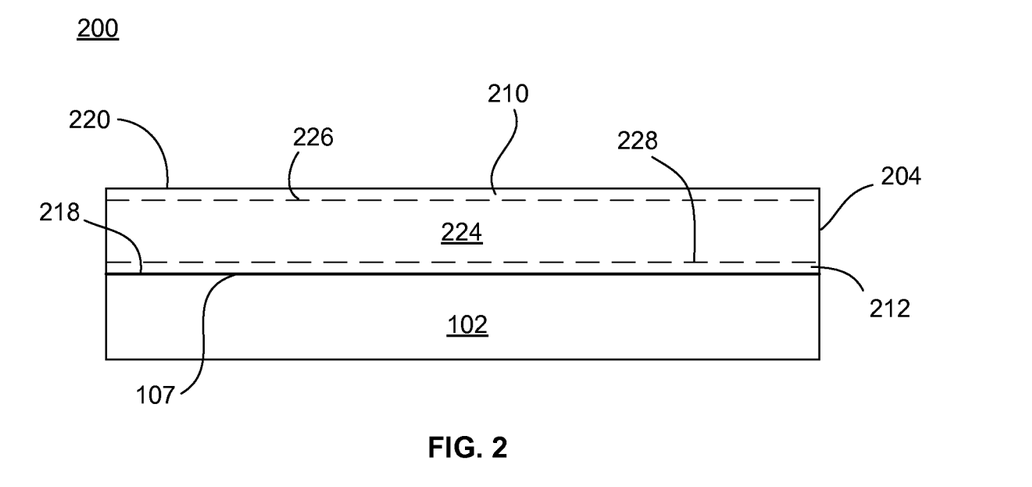
FIG. 2 is a schematic illustration of a cross section of a light-emitting device utilizing an LED with a ceramic wavelength converter according to another embodiment of this invention.

Referring now to FIG. 2, a light-emitting device 200 is illustrated having a similar configuration to the pc-LED shown in FIG. 1 except that the ceramic wavelength converter 204 has integrally formed as-sintered surface layers 210 and 212 at both major surfaces, viz. light-emitting surface 220 and bottom surface 218, respectively. As in the previous embodiment, the surface layers 210 and 212 contain an alumina second phase, preferably as alumina crystallites, formed during the sintering process. The boundaries for surface layers 210, 212 are indicated by dashed lines 226 and 228, respectively. Preferably, the surface layers 210, 212 have a thickness of less than about 50 µm and more preferably less than about 10 µm. The bulk material 224 of the ceramic converter 204 is a substantially transparent, single-phase material comprised of the alumina-based phosphor. In particular, the bulk material contains no significant amount of scattering centers such as pores or $2^{nd}$ phase inclusions.

In one embodiment, the ceramic wavelength converter can be made by the steps of: (a) combining a precursor material with a liquid-phase forming sintering aid to form a green state mixture, (b) shaping the green state mixture to form a green state shape of the ceramic converter, such as a plate; (c) heating the green state shape to remove the binder and form a pre-fired ceramic material; and (d) sintering the pre-fired ceramic material to form the ceramic wavelength converter. As described above, the sintering is enhanced by the sintering aid additive. Preferably, the precursor material may comprise cerium-activated yttrium aluminum garnet (YAG:Ce) or cerium-activated lutetium aluminum garnet (LuAG:Ce). The sintering aid may comprise materials that form silicate liquids during the sintering process. Preferably, the sintering aid is tetraethyl orthosilicate (TEOS). The green state mixture may further contain an organic binder to aid in the formation of the green state shape. Methods for forming the green state shape include injection molding, tape casting, dry pressing, slip casting, or extrusion.

In another embodiment, the green state mixture may contain more than one precursor materials and heating of the green state shape causes the precursor materials to react to form the ceramic converter. For example, the green state mixture may comprise a mixture of oxides formulated to produce the desired luminescent ceramic, such as a mixture of $Y_2O_3$, $Al_2O_3$ and $CeO_2$.

Preferably, the heating in step (c) may be performed at a temperature up to 1150° C. More preferably, the heating in step (c) may be performed at a time-temperature cycle of: increasing temperature from 25° C. to 400° C. in 4 hours, increasing temperature from 400° C. to 1150° C. in 4 hours, holding the temperature at 1150° C. for a time period ranging from 0.5 to 2 hours, and decreasing the temperature to 25° C. in 3 hours. The pre-fired ceramic material is preferably sintered at 1500° C.-1825° C. More preferably, the pre-fired ceramic material is sintered in a wet hydrogen atmosphere (−10° C. to 15° C. dewpoint) at 1500° C.-1825° C. for a time period ranging from 1 minute to 4 hours.

In a preferred embodiment, the ceramic wavelength converter is a garnet phosphor (e.g., YAG:Ce or LuAG:Ce) and formation of the alumina second phase in the surface layers is a result of the combination of the addition of small amounts of a tetraethyl orthosilicate (TEOS) sintering aid and the sintering conditions. The TEOS forms a silicate liquid phase at sintering temperatures to promote pore removal during sintering. The absence of any significant porosity results in a substantially transparent bulk material comprised of the alumina-based ceramic. The silicate liquid phase generated by the TEOS dissolves any alumina $2^{nd}$ phase that might occur in the bulk of the alumina-based ceramic, most likely by forming an alumino-silicate liquid—alumina is well known to dissolve in silicate liquids at the sintering temperatures. It is believed that this alumino-silicate liquid phase is transported to the surface as the alumina-based ceramic sinters to full density. As it reaches the surface, the silica most likely volatizes as SiO vapor in the reducing atmosphere or is re-absorbed into the garnet crystal phase, leaving alumina $2^{nd}$ phase grains and/or crystallites at the surface.

EXAMPLES

A typical batch formulation for a YGdAG:Ce-based sintered ceramic wavelength converter uses 0.5 g of TEOS per 100 g of YGdAG:Ce powder yielding about 0.145 weight percent (wt.%) $SiO_2$ in the YGdAG:Ce ceramic. Significant variations in the levels of cerium and gadolinium may be utilized to make a variety of colors and amount of conversion with a given ceramic converter thickness. In particular, gadolinium content can range from 0 to 50 percent of the yttrium content and more preferably from 10 to 20 percent. Cerium content can range from 0.05 to 5 percent of the yttrium content and more preferably from 0.1 to 1 percent.

The ceramic wavelength converters may also be made from a mixture of the individual oxides instead of pre-reacted YGdAG:Ce powders. For example, a batch containing only a mixture of yttria, alumina, and ceria (with or without gadolinium oxide), and TEOS is processed into ceramic plates. The batch is milled for a length of time long enough to promote a good green microstructure (well-mixed, well-packed small powder particles with a fine and narrow distribution of void sizes between the particles). At that point, the batch is then formed into the desired part size and shape. The desired shape for a sintered ceramic converter plate is typically about 1 mm×1 mm square with a thickness of 70 to 150 microns. One corner of the plate may be cut out to provide room for a wire bond to the top surface of the LED chip. The size could be as small as 0.5 mm square for smaller LED chips.

The green parts are placed on an alumina setter plate which is then placed in an air atmosphere furnace and heated using a typical time-temperature cycle of:
25° C. to 400° C. in 4 hours;
400° C. to 1150° C. in 4 hours;
Hold at 1150° C. for a period of from 0.5 to 2 hours; and
Cool to 25° C. in 3 hours.

This thermal process removes all of the organic and carbonaceous species including the organic binders used to hold the powders together and the organic portion of the TEOS. The hold temperature at 1150° C. is also high enough to allow the powder particles to neck together giving the parts sufficient strength to be handled.

The pre-fired ceramic plates are transferred onto molybdenum plates and sintered in a wet hydrogen atmosphere (−10° C. to 15° C. dewpoint) at 1500-1825° C. for a period of from 1 minute to 4 hours at peak temperature. During the hydrogen sintering, the plates shrink as the ceramic powders sinter and the matrix porosity is removed. If the initial powder particle sizes and mixing/milling conditions are performed properly, the matrix porosity will be reduced at elevated sintering temperatures to a level that the part exhibits a high degree of transparency or translucency. The TEOS sintering aid will form a small amount of silicate liquid at sintering temperatures which will increase the rate at which sintering occurs and porosity is removed.

It is apparent that the formation of the silicate liquid, which is known to dissolve aluminum oxide to form alumino-silicate, transports the small amount of alumina second-phase materials often found in sintered YGdAG or LuAG from the bulk to the surface of the ceramic during densification. The silicate is then apparently removed from the surface into the atmosphere through SiO vaporization (known to have a significant vapor pressure in the wet hydrogen atmosphere at the temperatures used for sintering), leaving behind an $Al_2O_3$ second phase at the surface of the ceramic.

Figure 3:
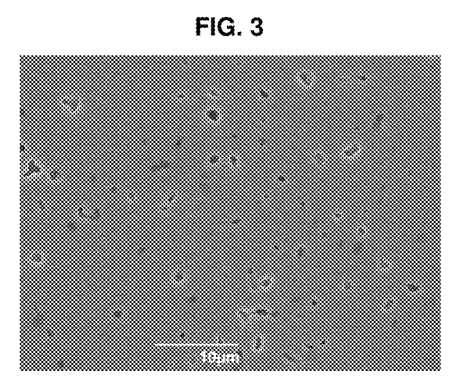
FIG. 3 is an SEM micrograph of a cross section of a sintered YGdAG:Ce ceramic wavelength converter showing pores and $2^{nd}$ phase alumina inclusions.
Figure 4:
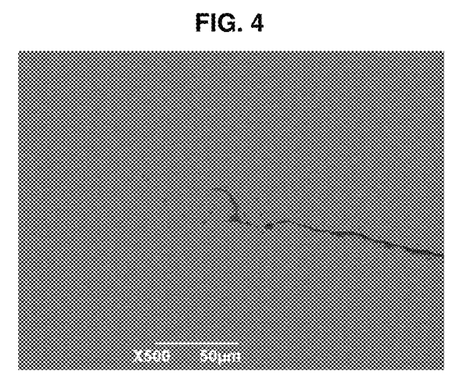
FIG. 4 is an SEM micrograph of a cross section of a sintered YGdAG:Ce ceramic wavelength converter made with a TEOS sintering aid.

More particularly, FIG. 3 is an SEM micrograph of a cross section of a YGdAG:Ce ceramic made without the TEOS sintering aid. As shown, the YGdAG:Ce ceramic contains a typical alumina $2^{nd}$ phase, the gray features, and a fair number of pores which appear as bright halos caused by electrical charging at the pores' edges by the electron beam of the scanning electron microscope (SEM). Comparatively, FIG. 4 is an SEM micrograph of a YGdAG ceramic made with the TEOS sintering aid. In this case, SEM analysis showed no evidence of any porosity or alumina $2^{nd}$ phase. In fact, a crack defect was required to verify that the cross-sectioned sample was actually in focus because of the lack of features on the polished cross-section of the ceramic. LuAG:Ce ceramics sintered with the TEOS sintering aid exhibited a similar lack of an significant porosity or alumina second phase in the bulk material.

Figure 5:
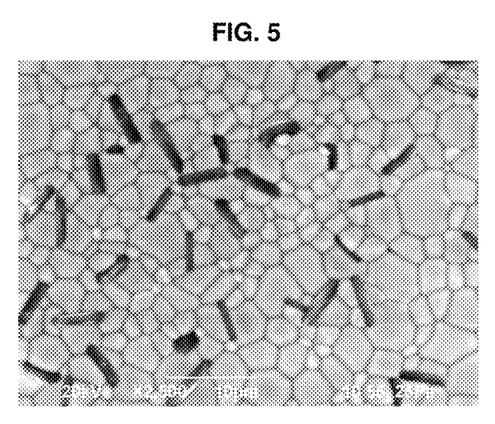
FIG. 5 is an SEM of the surface of a sintered YGdAG:Ce ceramic wavelength converter made with a TEOS sintering aid.
Figure 6:
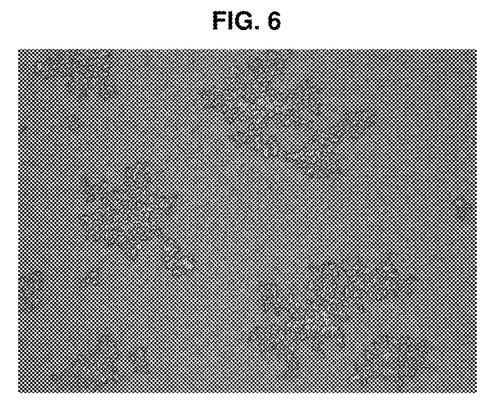
FIG. 6 is an optical microscope image of the surface of a sintered LuAG:Ce ceramic wavelength converter made with a TEOS sintering aid.

SEM and optical microscope analyses of the as-sintered surfaces of YGdAG:Ce and LuAG:Ce ceramics made with the TEOS sintering aid are shown in FIGS. 5 and 6, respectively. In each case, a second phase comprising alumina was observed on the surface. More particularly, with regard to FIG. 5, the SEM micrograph reveals a $2^{nd}$ phase of alumina crystallites on surface of the YGdAG:Ce made with the TEOS sintering aid. The alumina crystallites appear in the micrograph as dark crystals that are located at the grain boundaries of the polycrystalline YGdAG:Ce. The alumina crystallites were estimated to comprise about 8-9% of the surface. With regard to FIG. 6, the optical microscope image of the LuAG:Ce ceramic made with the TEOS sintering aid reveals a polycrystalline LuAG:Ce ceramic with an average grain size are about 2.5 µm. More importantly, $2^{nd}$ phase clusters of 2 to 20 µm size alumina grains are observed with the clusters ranging from about 50-150 µm in diameter.

It should be noted that LuAG:Ce ceramics made with the TEOS sintering aid but sintered in vacuum instead of a wet hydrogen atmosphere did not show any indication of the $2^{nd}$ phase alumina grains on the surface. Therefore, while the addition of the sintering aid is important, it is also important that the ceramics not be sintered in vacuum. Otherwise the alumina $2^{nd}$ phase will not form at the surface of the ceramics.

Figure 7:
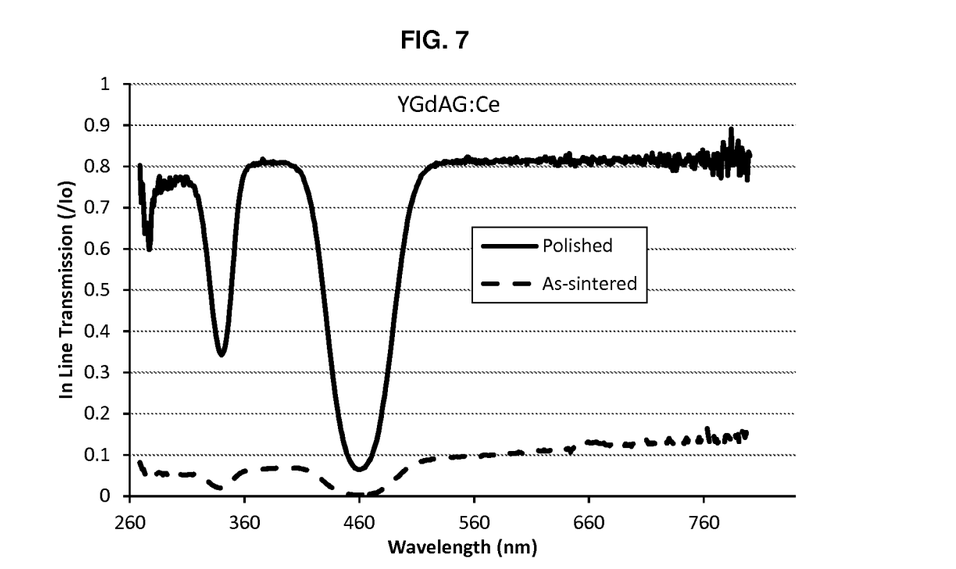
FIG. 7 compares the in-line transmittance of a YGdAG:Ce ceramic wavelength converter sintered with a TEOS sintering aid in (i) an as-sintered condition and (ii) polished to remove the $2^{nd}$ phase alumina crystals on the surface.

The transparency of the bulk ceramic can be seen in FIG. 7 which compares the in-line transmittance of an as-sintered YGdAG:Ce ceramic plate with the ceramic plate after polishing both sides to remove the surface layer having the alumina $2^{nd}$ phase. The two absorption peaks near 350 nm and 460 nm are due to the $Ce^{3+}$ activator. The in-line transmittance of the as-sintered ceramic in the 550-750 nm range is only ~10-12% while that of the polished sample is ~82%. Similarly, laser scatterometer data for an as-sintered YGdAG:Ce ceramic converter plate was taken using a 633 nm red He—Ne laser incident on the ceramic with the light measured at 360° around the sample. The data showed a considerable amount of backscatter (optical power at angles >90°) and a significant reduction in in-line transmittance (1.7%) for the as-sintered plate. After polishing both sides of the converter plate to remove the surface layer, the converter exhibited a high degree of transparency with very little backscatter and near-theoretical in-line transmittance in the forward direction.

In order to demonstrate the effect on the lumen output of a pc-LED configuration made with the ceramic wavelength converter plates, 2 cm×2 cm×390 µm samples of a YGdAG:Ce ceramic wavelength converter plate made in accordance with this invention were placed over the top of 1 mm blue LED. As seen in Table 1, an enhanced yellow emission was observed in the samples having at least one of the as-sintered surface layers having alumina $2^{nd}$ phase. In particular, there was a 12% greater lumen output when $2^{nd}$ phase-containing surface layer is on the light-emitting (exit) side of the converter as compared to the using the same converter with both sides polished to remove the surface layers (approx. 40 µm from each surface). (Lm/Wo-b is the lumen output of the LED plus converter divided by the optical wattage measured for the LED without the converter.)

TABLE 1

|  | $C_x$ | $C_y$ | Lumen | Watt |
|---|---|---|---|---|
| blue LED (no converter) | 0.163 | 0.020 | 10.6 | 0.409 |
| pc-LED configuration | $C_x$ | $C_y$ | Lumen | Lm/Wo-b |
| converter with both sides polished | 0.327 | 0.290 | 69 | 170 |
| converter with exit side as-sintered | 0.356 | 0.356 | 78 | 190 |

As shown in Table 2, an even greater enhancement in lumen output is observed in a pc-LED configuration if both major sides of the converter have the as-sintered surface layer. In this set-up, the pc-LED configuration with the converter having the as-sintered surface layer only on the light-emitting (exit) side exhibited a 9% increase in lumens over the configuration made with the converter which had the as-sintered surface layer removed from both sides. Even better, the configuration made with the converter having the as-sintered surface layer on both sides exhibited a 16% increase in lumen output over the configuration which had both sides polished.

TABLE 2

| pc-LED configuration | $C_x$ | $C_y$ | Lumen | Lm/Wo-b |
|---|---|---|---|---|
| converter with both sides polished | 0.345 | 0.322 | 69 | 187 |
| converter with exit side as-sintered | 0.359 | 0.362 | 75 | 204 |
| converter with both sides as-sintered | 0.388 | 0.415 | 80 | 218 |

Figure 8:
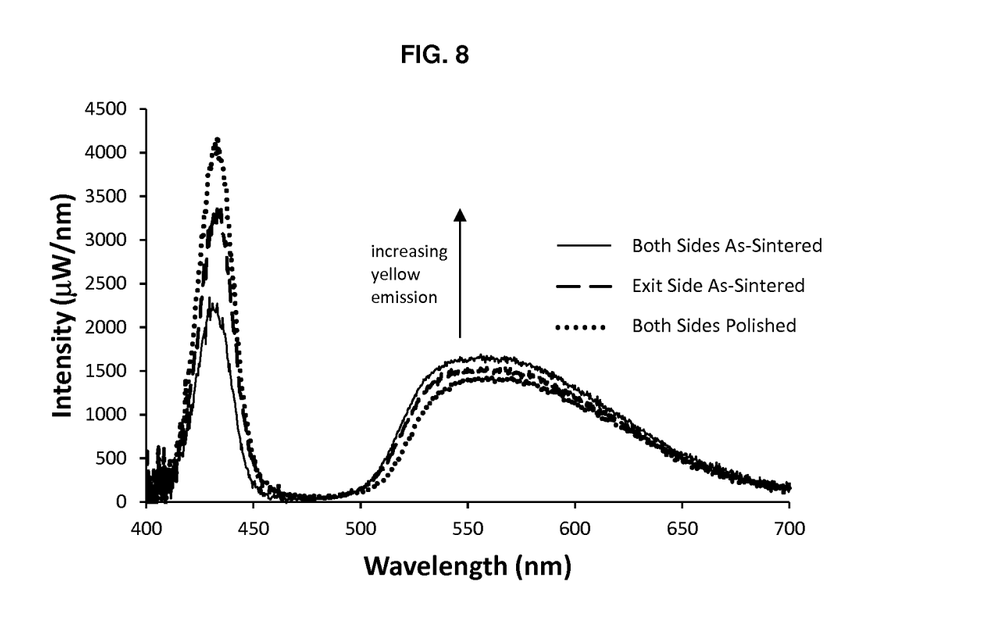
FIG. 8 compares the emission spectrum of a pc-LED having an as-sintered YGdAG:Ce ceramic converter plate with the emission spectra from the same pc-LED configuration wherein one or both sides of the converter have been polished to remove the surface layer having the $2^{nd}$ phase of alumina.

FIG. 8 compares the emission spectrum of a pc-LEDs having an as-sintered YGdAG:Ce ceramic converter plate with the emission spectra from the same configuration wherein one or both sides have been polished to remove the surface layer having the alumina $2^{nd}$ phase. The increase in lumen output for the pc-LEDs made with converters having at least one side with the as-sintered surface layer is attributable to the increased yellow emission from the converter at around 550 nm. This increase is likely a combination of increased scattering caused by the alumina $2^{nd}$ phase at the surface leading to a greater conversion of the primary blue light from the LED and a reduction in total internal reflection due "roughening" of the surface by the alumina $2^{nd}$ phase, and in particular the alumina crystallites that were observed to form on at the surface of the YGdAG:Ce wavelength converters made with the TEOS sintering aid.

While there have been shown and described what are at present considered to be preferred embodiments of the invention, it will be apparent to those skilled in the art that various changes and modifications can be made herein without departing from the scope of the invention as defined by the appended claims.

We claim:

1. A wavelength converter comprising a solid monolithic piece of a luminescent ceramic material, the ceramic material comprising an alumina-based phosphor capable of converting primary light having a first peak wavelength into secondary light having a second peak wavelength, a bulk portion of the converter being substantially transparent, and the converter having at least one major surface with an as-sintered surface layer having an alumina second phase.

2. The wavelength converter of claim 1 wherein the alumina second phase comprises alumina crystallites.

3. The wavelength converter of claim 1 wherein a thickness of the surface layer is less than about 50 µm.

4. The wavelength converter of claim 1 wherein a thickness of the surface layer is less than about 10 µm.

5. The wavelength converter of claim 1 wherein the converter is a flat plate.

6. The wavelength converter of claim 5 wherein both major surfaces of the plate have the as-sintered surface layer having an alumina second phase.

7. The wavelength converter of claim 5 wherein the converter has a thickness of between 20 µm and 500 µm.

8. The wavelength converter of claim 5 wherein the converter has a thickness of between 100 µm and 250 µm.

9. The wavelength converter of claim 2 wherein the alumina crystallites range in size from about 0.5 µm to about 25 µm.

10. The wavelength converter of claim 2 wherein the alumina crystallites range in size from about 1 µm to about 10 µm.

11. The wavelength converter of claim 1 wherein the alumina second phase covers between about 1 to about 50 percent of the major surface.

12. The wavelength converter of claim 1 wherein the alumina second phase covers between about 5 to about 25 percent of the major surface.

13. A light-emitting device, comprising: a light-emitting diode that emits a primary light having a first peak wavelength and a wavelength converter positioned to receive the primary light from the light-emitting diode, the wavelength converter comprising a solid monolithic piece of a luminescent ceramic material, the ceramic material comprising an alumina-based phosphor capable of converting at least a portion of the primary light into secondary light having a second peak wavelength, a bulk portion of the converter being substantially transparent, and the converter having at least one major surface with an as-sintered surface layer having an alumina second phase.

14. The light-emitting device of claim 13 wherein the converter is a flat plate and both major surfaces of the plate have the as-sintered surface layer having an alumina second phase.

15. The light-emitting device of claim 13 wherein the converter is a flat plate and has a thickness of between 20 μm and 500 μm.

16. The light-emitting device of claim 13 wherein the alumina second phase comprises alumina crystallites.

17. The light-emitting device of claim 13 wherein the alumina-based phosphor is represented by a general formula $A_3B_5O_{12}$:Ce, wherein A is Y, Sc, La, Gd, Lu, or Tb and B is Al, Ga or Sc.

18. The light-emitting device of claim 13 wherein the alumina-based phosphor is selected from $Y_3Al_5O_{12}$:Ce, $(Y,Gd)_3Al_5O_{12}$:Ce, $Tb_3Al_5O_{12}$:Ce, and $Lu_3Al_5O_{12}$:Ce.

19. The light-emitting device of claim 13 wherein the alumina second phase covers between about 1 to about 50 percent of the major surface.

20. The light-emitting device of claim 13 wherein the alumina second phase covers between about 5 to about 25 percent of the major surface.

21. The light-emitting device of claim 13 wherein a thickness of the surface layer is less than about 50 μm.

22. The light-emitting device of claim 13 wherein a thickness of the surface layer is less than about 10 μm.

* * * * *